United States Patent [19]

Ogawa et al.

[11] Patent Number: 4,633,121
[45] Date of Patent: Dec. 30, 1986

[54] COMB-SHAPED PIEZOELECTRIC DRIVE DEVICE

[75] Inventors: Yasuhiko Ogawa, No. 322-1, Oaza Kurigashima, Takenezawa-machi, Shioya-gun, Tochigi; Kazuhiko Nakayama, Namiki 3-chome 505, No. 1211, Oaza Sasagi, Sakura-mura, Niihari-gun, Ibaraki; Minoru Yasuda, Aichi, all of Japan

[73] Assignees: NGK Spark Plug Co., Ltd., Aichi; Yasuhiko Ogawa, Tochigi; Kazuhiko Nakayama, Ibaraki, all of Japan

[21] Appl. No.: 736,043

[22] Filed: May 20, 1985

[30] Foreign Application Priority Data

May 29, 1984 [JP] Japan .................................. 59-108759

[51] Int. Cl.⁴ ............................................ H01L 41/08
[52] U.S. Cl. .................................... 310/332; 310/331; 310/366; 310/367
[58] Field of Search .............................. 310/330–331, 310/367, 368, 366

[56] References Cited

U.S. PATENT DOCUMENTS

| 3,229,387 | 1/1966 | Linvill | 310/332 X |
| 4,072,959 | 2/1978 | Elmqvist | 310/330 X |
| 4,112,279 | 9/1978 | Brohard | 310/332 X |
| 4,420,266 | 12/1983 | Kolm et al. | 310/332 X |
| 4,450,375 | 5/1984 | Siegal | 310/331 |

FOREIGN PATENT DOCUMENTS 0060005  5/1977  Japan ................................... 310/332

Primary Examiner—Mark O. Budd
Attorney, Agent, or Firm—Sughrue, Mion, Zinn, Macpeak & Seas

[57] ABSTRACT

A comb-shaped piezoelectric unit, such as may be used for a mechanical signal source or in a display device for displaying raised letters for reading by blind persons. The piezoelectric unit includes a plurality of strip-shaped drive members extending from a common base part, a first metal electrode layer on each of the drive members with the first metal electrode layers among the drive members being insulated from one another, and a common metal electrode layer formed on the other side of the drive members, connected commonly to all drive members. To construct a display device for the blind, pins are attached to the free ends of each of the drive members, the pins being protrudable through respective holes in a rigid plate when the corresponding drive members are actuated by applying a voltage thereto.

3 Claims, 4 Drawing Figures

4,633,121

COMB-SHAPED PIEZOELECTRIC DRIVE DEVICE

BACKGROUND OF THE INVENTION

The present invention relates to a comb-shaped piezoelectric drive device composed of a plural number of strip-shaped drive members having first ends joined to a common base part and free ends which flex upon application of a voltage across the drive members. Such a piezoelectric drive device can be employed as a mechanical signal source and is applicable to data transmitting devices and the like. It is well known in the art that a mechanical signal source can be implemented by selectively applying a voltage to the drive members of such a piezoelectric drive device.

Heretofore, the strip-shaped piezoelectric elements were manufactured separately and then secured to a base part. This manufacturing technique requires much labor and time. Moreover, the dimensional accuracy of a piezoelectric drive device manufactured by such a technique is low.

SUMMARY OF THE INVENTION

Accordingly, it is an object of the present invention to reduce the amount of labor required in manufacturing such a piezoelectric drive device and to improve the dimensional accuracy of the device.

In accordance with the above and other objects, a piezoelectric drive device is provided in which a plurality of strip-shaped piezoelectric elements extend from a common integral base part and are driven selectively.

More specifically, in accordance with the invention, a comb-shaped piezoelectric drive device is provided including a comb-shaped piezoelectric unit comprising a plurality of strip-shaped drive members extending from a common base part, a first metal electrode layer formed on one main surface of each of the drive members and divided so that the first metal electrode layers of the drive members are electrically insulated from one another, and a common metal electrode layer formed on the other main surface of the drive member, the drive members being electrically coupled to one another through the common electrode layer.

In a preferred embodiment, the piezoelectric units are employed to form a drive device for displaying raised letters, such as may be used to display messages to blind persons. In such a case, plural seats are provided in stepwise form on a base board, and respective ones of the piezoelectric units are fixed to the seats through the base parts on which the common metal electrode layers are formed. Pins are provided at the free end portions of each of the drive members, and the free ends of the pins are capable of being protruded through respective holes formed in a rigid plate upon application of a voltage to the corresponding drive member.

BRIEF DESCRIPTION OF THE DRAWINGS

FIGS. 2A, 2B, and 2C show piezoelectric drive devices which are employed in a raised letter display device, of which FIG. 2A is top view, FIG. 2B is a side sectional view taken along a line A—A in FIG. 2A, and FIG. 2C is a front view.

DESCRIPTION OF THE PREFERRED EMBODIMENTS

Figure 1:
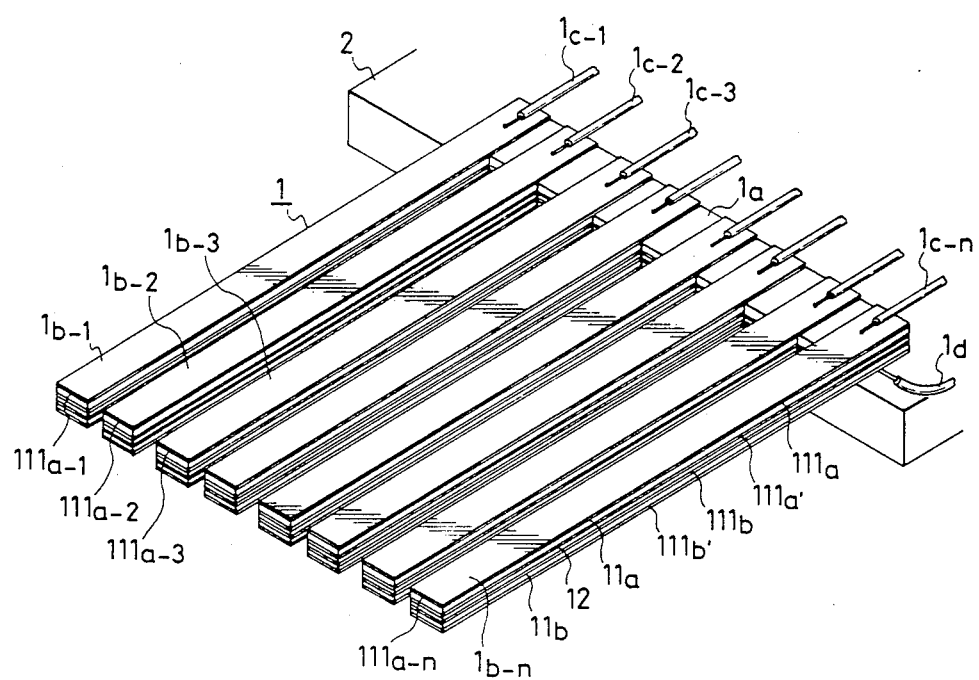
FIG. 1 is a perspective view showing a comb-shaped piezoelectric drive device according to the invention.

FIG. 1 shows an example of a comb-shaped piezoelectric drive device constructed according to the invention. The piezoelectric drive device 1 is of a bimorphic structure and includes a pair of thin piezoelectric ceramic plates 11a and 11b composed of polarized lead titanium zirconate on main surfaces of which metal electrode layers 111a and 111a' and metal electrode layers 111b and 111b' are formed by vacuum-depositing silver or the like, and a shim 12, formed as a thin plate of relatively elastic metal such as brass, upon which the pair of thin plates 11a and 11b are stacked. A plurality of groove-shaped cuts which separate drive members 1b-1, 1b-2, 1b-3, . . . and 1b-n extend from the base part 1a of the structure. In order to individually drive the drive members 1b-1 through 1b-n, the metal electrode layer 111a, which is a common top layer of the drive members 1b-1 through 1b-n, is cut at its base part to form a plurality of metal electrode layers 111a-1, 111a-2, 111a-3, . . . and 111a-n in the form of parallel belts which are separated from one another at their base part. Lead wires 1c-1, 1c-2, 1c-3, . . . and 1c-n are connected to the respective metal electrode layers 111a-1, 11a-2, . . . and 111a-n by brazing, and a common lead wire 1d is connected to the metal electrode layer 111b', which is the lowest layer in the structure. In addition, a drive circuit (not shown) is provided which is adapted to selectively apply a driving voltage between the lead wire 1d and the lead wires 1c-1 through 1c-n. Furthermore, the lowermost metal electrode layer 111b' is welded to a base board 2. Driving voltage is applied to the drive members to cause their free ends to bend, thus permitting the device to be employed as mechanical signal sources for relays, etc. For such an application, small protrusions (not shown) may be provided at the free ends of the drive pieces.

As described above, in order to individually drive the drive members 1b-1 through 1b-n, cuts are formed in the uppermost metal electrode layer 111a in the form of parallel belts which extend along the drive members. Since the cuts are used to insulate the uppermost metal layers of the drive members from one another, the metal electrode layer may also be removed in the region between the end of the base part and lines connecting the drive members or lines slightly shifted from the ends of the drive members. In the case where the base board 2 welded to the metal electrode layer 111b' at the base part 1a is made of an electrically conductive material such as a metal, the common lead wire 1d may be connected to the base board 2 instead of the metal electrode layer 11b'. Furthermore, instead of the illustrated bimorphic structure, a monomorphic structure may be employed in which a single piece of thin piezoelectric ceramic plate is employed. In this case, the thin plate has one main surface covered by a metal electrode layer with cuts extending along the drive members, as in the above-described bimorphic structure. The other main surface is covered in its entirety with a metal electrode layer, and a thin plate of elastic metal is bonded to the other main surface to reinforce the structure.

Figure 2A:
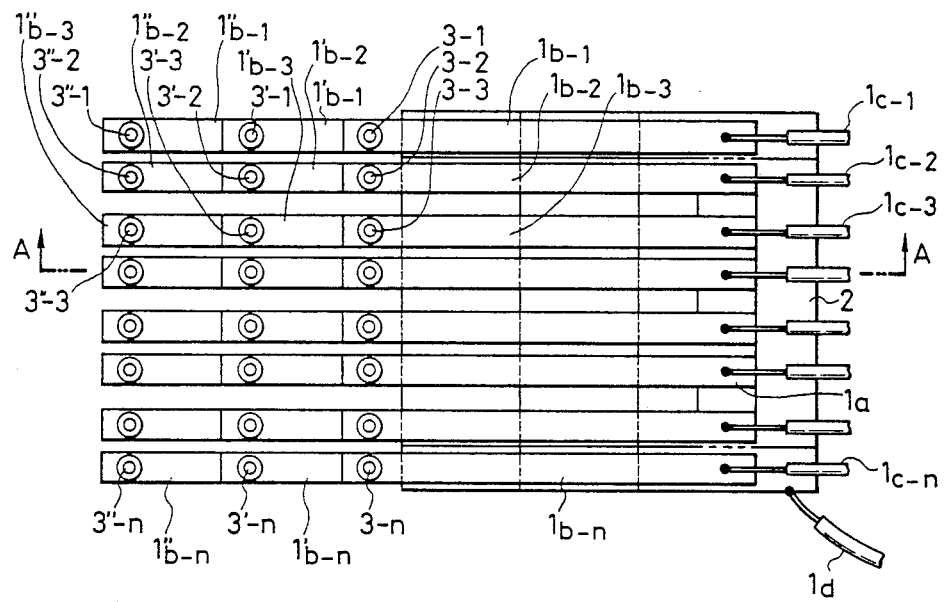
Figure 2B:
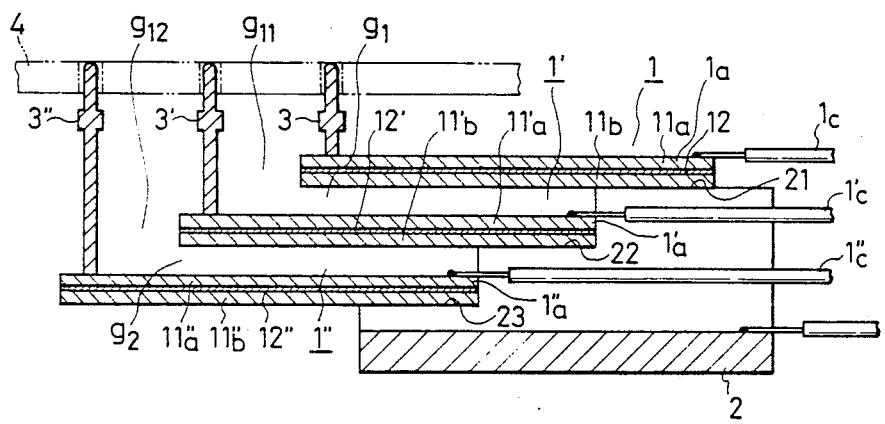
Figure 2C:
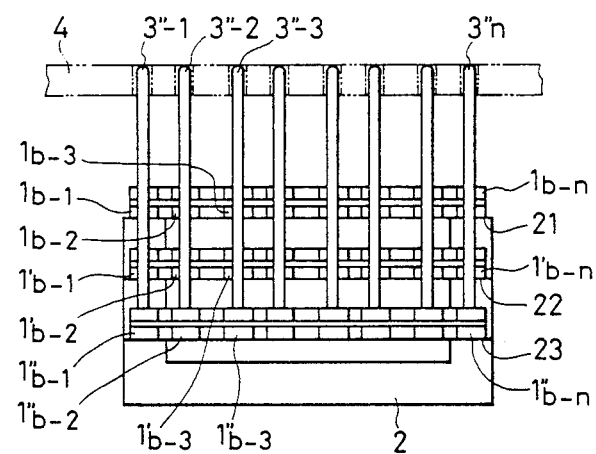

FIGS. 2A through 2C show a six-point raised character display device to which the technical concept of the invention is applied. Such a device may be used, for instance, to construct an automatic Braille display device.

A raised letter in such an application can be composed of six (3×2) points, three points in the vertical direction and two points in the horizontal direction. A variety of symbols can be displayed by combinations of the six points. Each point may, for instance, be 1 mm in diameter, the distance between the centers fo adjacent points in the vertical direction may be 2.2 mm, and the distance between the centers of adjacent points in the horizontal direction 2 mm.

The six points are arranged in a frame. Sentences using the raised letters are expressed by arranging plural ones of such frames in a horizontal direction. The frames are arranged so that the distance between the centers of adjacent points in adjacent frames is 3 mm, and, for instance, thirty-two frames may be provided per line. In the frames thus arranged, the points form raised letters by selectively causing them to protrude through holes in a rigid sheet.

In a display device having 32 characters, 192 small holes corresponding to the above-described protrusions (6 points × 32 letters) are formed in a rigid plate. In a conventional device of this type, pins are selectively protruded by flexible wires extending from plungers in such a manner that the pins are loosely moved up and down in the small holes. However, the conventional device is not so practical because, in order to selectively protrude these pins above the rigid plate thereby to form desired raised characters, it is necessary to provide 192 plungers. The invention eliminates this drawback.

In FIGS. 2A through 2C, reference numerals 1, 1' and 1'' designate bimorphic structures. As in the bimorphic structure shown in FIG. 1, the bimorphic structure 1 is composed of a pair of thin piezoelectric ceramic plates 11a and 11b, on the main surfaces of which metal electrode layers (not shown) are formed, and a thin plate 12 of a relatively elastic metal through which the pair of thin plates 11a and 11b are joined. Similarly, the bimorphic structure 1' is made up of a pair of thin piezoelectric ceramic plates 11a' and 11b' having metal electrode layers and a shim 12'. The third bimorphic structure 1'' is made up of a pair of thin piezoelectric ceramic plates 11a'' and 11b'' having metal electrode layers and a shim 12''. In the structures 1, 1', and 1'', a plurality of drive members 1b-1, 1b-2, 1b-3, ... and 1b-n, a plurality of drive members 1'b-1, 1'b-2, 1'b-3, ... and 1'b-n, and a plurality of drive members 1''b-1, 1''b-2, 1''b-3, ... and 1b''-n are defined by groove-shaped cuts which extend forwardly from base parts 1a, 1'a, and 1''a, respectively. Further, reference numeral 2 designates a base board which is open upwardly and has seats 21, 22, and 23 on its both side walls. Common metal electrode layers on the lower main surfaces of the bimorphic structure piezoelectric units 1, 1', and 1'' are fixedly secured on the seats 21, 22, and 23, respectively. Of these seats, the seats 22 and 23 are stepped seats which extend forwardly. Accordingly, the piezoelectric units 1, 1', and 1'' form three layers. Vertical spacings $g_1$ and $g_2$ are provided between the piezoelectric units 1 and 1' and between the piezoelectric units 1' and 1'', respectively, and there are provided horizontal spacings $g_{11}$ and $g_{12}$ between the front ends of the piezoelectric units 1 and 1' and between the front ends of the piezoelectric units 1' and 1'', respectively.

Further in FIGS. 2A through 2C, reference numerals 3-1, 3-2, 3-3, ... and 3-n, 3'-1, 3'-2, 3'-3, ... and 3'-n, and 3''-1, 3''-2, 3''-3, ... and 3''-n designate pins fixed to the drive pieces 1b-1 through 1b-n, 1'b-1 through 1'b-n, and 1''b-1 through 1''b-n, respectively. The first groups of pins 3-1 through 3-n, the second group of pins 3'-1 through 3'-n, and the third group of pins 3''-1 through 3''-n are different in length from one another. The upper end of each of these pins is received in a corresponding small hole in a rigid plate 4.

The pins 3-1 through 3-n, 3'-1, through 3'-n, and 3''-1 through 3''-n fixed to the front end portions of the drive members 1b-1 through 1b-n, 1'b-1 through 1'b-n, and 1''b-1 through 1''-n which extend from the piezoelectric units 1, 1', and 1'', respectively, are typically 1 mm in diameter. The spacing $g_{11}$ between a first line connecting the centers of the pins 3-1 through 3-n and a second line connecting the centers of the pins 3'-1 through 3'-n, and the spacing $g_{12}$ between the second line and a third line connecting the centers of the pins 3''-1 and 3''-n are, in this example, 2.2 mm. Furthermore, the distance between a line connecting the pins 3-1, 3'-1, and 3''-1 on the drive pieces 1b-1, 1'b-1, and 1''b-1 in the first column and a line connecting the pins 3-2, 3'-2, and 3''-2 on the drive pieces 1b-2, 1'b-2, and 1''b-2 is here 2 mm. As a result, these pins are positioned at points forming one raised letter constituted by six points.

To juxtapose two characters, the pins on the drive members in the third and fourth columns are positioned similarly as in the above-described case, and the distance between the line connecting the pins 3-2, 3'-2, and 3''-2 on the drive members in the second column and a line connecting the pins 3-3, 3'-3, and 3''-3 is 3 mm. The pins for 32 letters in one line are provided on respective drive members in this manner. For instance in the case of FIGS. 2A through 2C, 24 drive pieces (8 columns × 3 layers) form four raised letters. If eight piezoelectric devices thus formed are arranged side by side, a total of 192 pins for 32 letters in a line is provided.

When voltage is selectively applied between a desired one of the lead wires 1c, 1'c, and 1''c connected to the base parts of the drive members with the 192 pins and a common lead wire connected to the lowermost metal electrode layers of the piezoelectric units, the selected drive member flexes upwardly so that the end of the corresponding pin carried by that drive member protrudes above the rigid plate through the respective small hole. Desired raised characters are formed in this manner. After 32 raised letters thus formed have been read, application of the voltage is suspended to allow the pins to be retracted to their original positions. From the retracted position, voltage is again selectively applied to the lead wires to selectively cause the ends of selected pins to protrude above the rigid plate so that 32 raised letters in a next line are formed. In this same manner, raised letters are formed in succeeding lines.

As is apparent from the above description, in the comb-shaped piezoelectric drive device of the invention, a number of strip-shaped drive members can be selectively driven. Therefore, when the device is employed as a mechanical signal source in a relay, data transmission device, or the like, the device can be miniaturized and its wiring simplified. Furthermore, since all drive members extend from a single base part, they cannot be shifted when installed. That is, the drive members operate accurately at all times. Employment of the device of the invention is most effective in the case where, as in a raised letter display device, a number of drive members are driven. In manufacturing the piezoelectric drive device of the invention, as described hereinabove, a pair of thin piezoelectric ceramic rectangular plates, each having metal layers on its main surfaces, are bonded together through a metal shim or otherwise each piezoelectric element is reinforced with a metal thin plate, the element is cut with a diamond cutter or the like beginning from one end face to form the individual drive members, and the uppermost metal layer is cut at its base part to electrically insulate the drive members from one another. Thus, the device of the invention can be mass-produced with high efficiency.

We claim:

1. A comb-shaped piezoelectric drive device for displaying raised letters for the blind comprising:
   a plurality of comb-shaped piezoelectric units each comprising: a plurality of strip-shaped drive members extending from an integral common base part; a first metal electrode layer formed on one main surface of each of said drive members, said first metal electrode layers of each of said drive members being electrically insulated from one another; and an electrically continuous common metal electrode layer formed on the other main surface of said drive members;
   a plurality of seats provided in the form of steps on a base board, said piezoelectric units being fixed to respective ones of said seats through base parts on said other main surfaces on which said common metal electrode layers are formed;
   a plurality of pins, each of said pins being fixed to a free end portion of a respective one of said drive members; and
   a rigid plate having holes therein through which ends of said pins are selectively protruded upon selective application of a voltage between said common metal electrode layers and said first electrode layers.

2. The comb-shaped piezoelectric drive device of claim 1, wherein said strip-shaped drive members and said common base part are integrally formed from a pair of thin piezoelectric ceramic plates formed of polarized lead titanium zirconate joined by a shim formed of a relatively elastic metal.

3. The comb-shaped piezoelectric drive device of claim 1, wherein said first metal electrode layers and said common metal electrode are formed of vacuum-deposited silver.

* * * * *